United States Patent [19]

Eitan

[11] 4,432,075

[45] Feb. 14, 1984

[54] ELECTRICALLY PROGRAMMABLE NON-VOLATILE MEMORY

[75] Inventor: Boaz Eitan, Sunnyvale, Calif.

[73] Assignee: Hebrew University of Jerusalem, Jerusalem, Israel

[21] Appl. No.: 327,474

[22] Filed: Dec. 4, 1981

[51] Int. Cl.³ .......................................... G11C 11/40
[52] U.S. Cl. ..................................... 365/185; 357/23
[58] Field of Search ...................... 365/184, 185, 189; 357/23 VT

[56] References Cited

U.S. PATENT DOCUMENTS 4,016,588  4/1977  Ohya et al. ......................... 365/185
4,037,242  7/1977  Gosney ............................... 365/185

OTHER PUBLICATIONS

Verwey, "Nonavalanche Injection of Hot Carriers into SiO$_2$", J. Appl. Phys., vol. 44, No. 6, 6/73, pp. 2681-2687.

Ning, "Hot-Electron Emission from Silicon into Silicon Dioxide", Solid-State Electronics, 1978, vol. 21, pp. 273-282.

Tarui et al., "Electrically Reprogammable Nonvolatile Semiconductor Memory", Proc. 5th Conf. (1973 Int.) on Solid-State Devices, Suppl. J. Japan Soc. Appl. Phys., vol. 43, 1974.

Bergeron, "Electrically Programmable Bipolar ROM Cell", IBM Tech. Disc. Bul., vol. 23, No. 12, 5/81, pp. 5294-5296.

Primary Examiner—Stuart N. Hecker
Attorney, Agent, or Firm—Blakely, Sokoloff, Taylor & Zafman

[57] ABSTRACT

A memory array is disclosed which employs a plurality of floating gate EPROM or E²PROM cells. Charge to program these cells is generated from charge generators, each shared by a plurality of cells. For example, one charge generator generates sufficient charge to allow selective programming of several hundred cells. The cells can be fabricated without the requirement to withstand high potentials, with less critical geometries and in some cases as two terminal devices.

29 Claims, 10 Drawing Figures

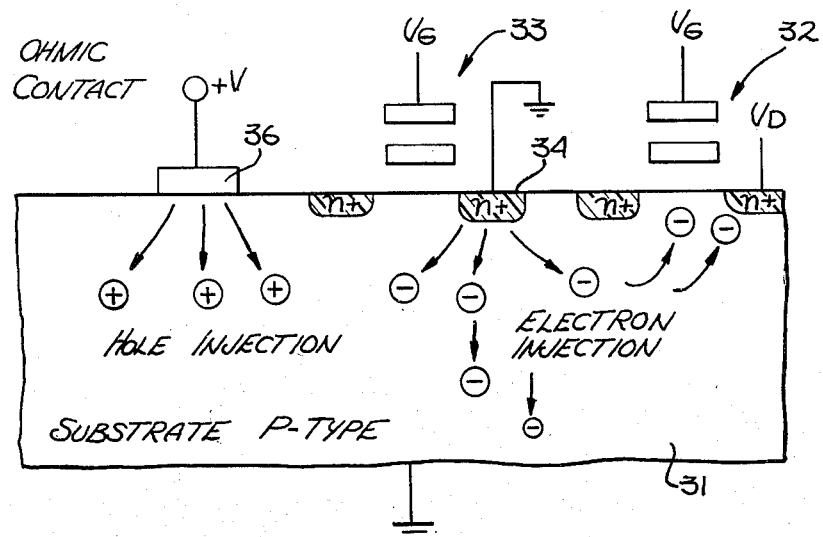
*Fig. 3*
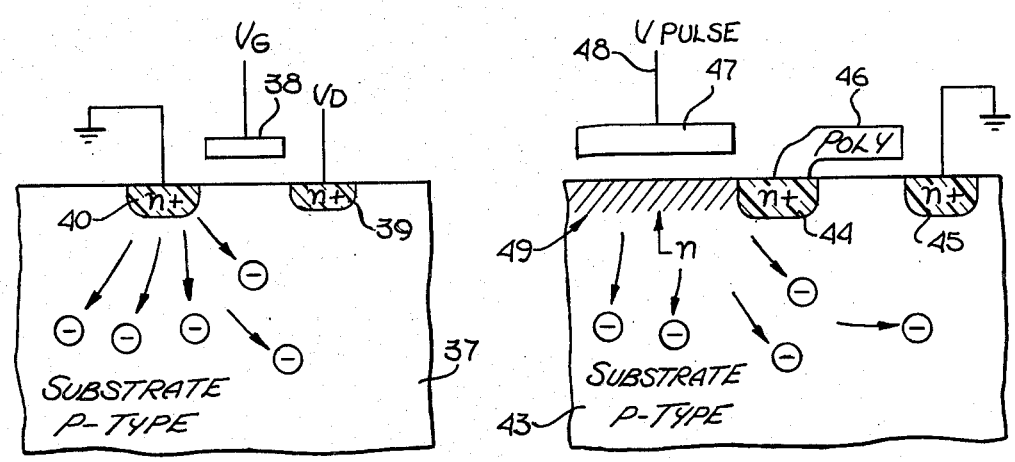
*Fig. 4* SATURATION (IMPACT IONIZATION)
*Fig. 5* CHARGE INJECTION CAPACITOR
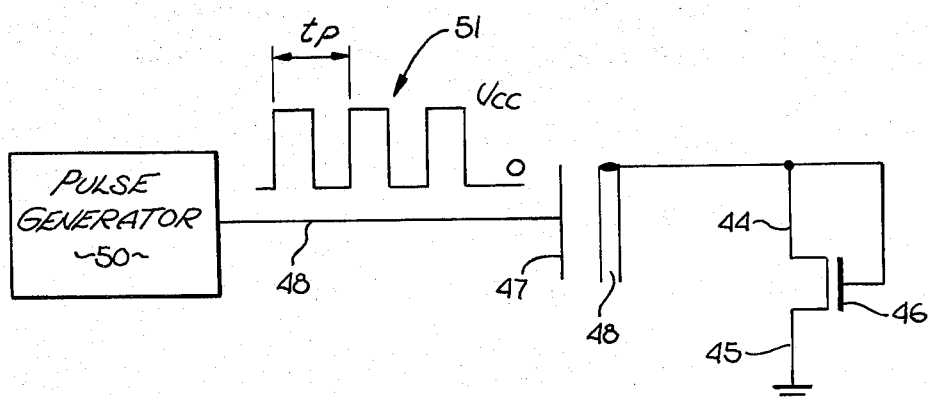
*Fig. 6*

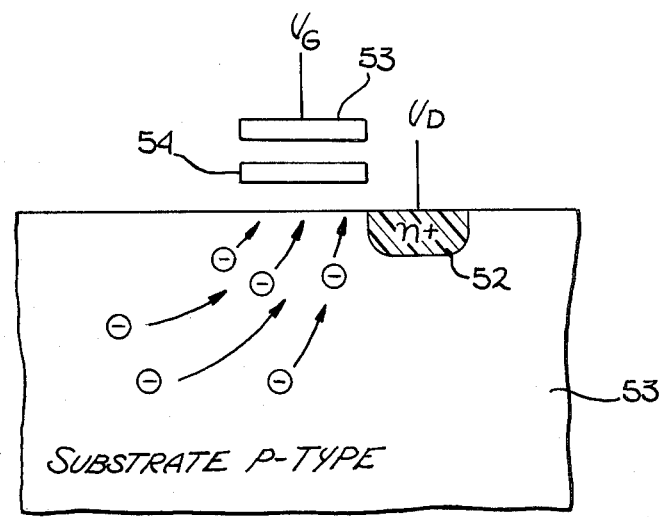
Fig. 7 (Two Terminal Device)
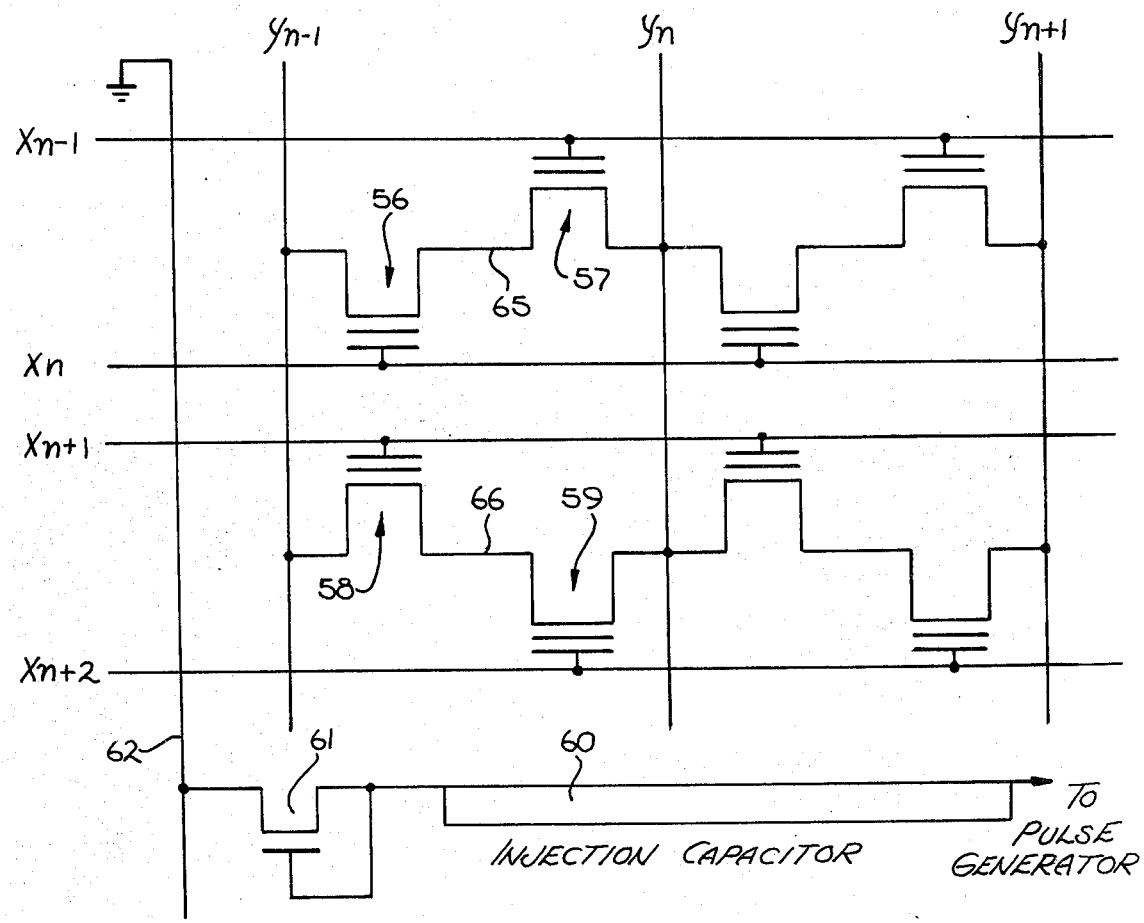
Fig. 8

ELECTRICALLY PROGRAMMABLE NON-VOLATILE MEMORY

BACKGROUND OF THE INVENTION

1. Field of the Invention

The invention relates to the field of electrically programmable and erasable, non-volatile memory cells.

2. Prior Art

Non-volatile memory cells, particularly those employing charge storing regions such as floating gates, are well-known. The first commercial memories employed floating gate devices which are charged by avalanche injection, that is, by avalanching one of the two substrate regions associated with each of the cells. This type of device is described in U.S. Pat. No. 3,660,819. Subsequent memories used channel injection, that is, charge is injected from the channel of each cell into the floating gate. Such cells are described in U.S. Pat. No. 3,996,657 and 4,114,255. In some cases, the cells are both electrically programmable and electrically erasable and rely on tunneling for both programming and erasing, such as shown in U.S. Pat. No. 4,203,158.

Summaries of the various charging techniques used to program memory cells are described in "Nonavalanche Injection of Hot Electrons into $SiO_2$" by J. F. Verwey, *Journal of Applied Physics,* Volume 44, No. 6, June, 1973 beginning at page 2681 and "Hot-Electron Emission from Silicon into Silicon Dioxide" by T. H. Ning, *Solid-State Electronics,* 1978, Vol. 21, pages 273–282.

In prior art cells, each cell includes means for generating charge which can be trapped, for example, in a floating gate. The present invention departs from this approach by utilizing a single source of charge for programming a plurality of cells. In general, a charge disturbance or imbalance is created in the substrate and excess electrons are accelerated toward a selected cell in order to charge that cell.

Perhaps the closest prior art is described in "Electrically Programmable Non-volatile Semiconductor Memory" by Tarui, et al, *Proceedings of the Fifth Conference (1973 International) on Solid-state Devices,* Tokyo, 1973, supplement to the *Journal of the Japan Society of Applied Physics,* Volume 43, 1974. In FIG. 11 of this article, a device is shown which uses hot carrier injection from a forward biased pn junction and subsequent acceleration to charge a floating gate. However, unlike the present invention, no use is made of a single source of charge for a plurality of cells.

SUMMARY OF THE INVENTION

An electrically programmable memory disposed on a substrate which includes a plurality of electrically programmable memory cells is described. Each of the cells includes at least one region disposed in the substrate, a charge storing region (e.g., floating gate) and a control gate. A charge generation means is used for causing a charge imbalance in the substrate such that sufficient charge is present for charging any one of the plurality of cells. Electrical means coupled to the cells are used for selectively applying potential to a selected cell such that charge is accelerated towards the selected cell. The charge overcomes the energy barrier between the charge storing region and substrate and becomes trapped in the charge storing region. In this manner, a plurality of cells may be programmed from a single source of charge. The prior art requirement that each of the cells withstand the higher programming potential is eliminated since each cell does not generate the charge it requires for programming.

BRIEF DESCRIPTION OF THE DRAWINGS

FIG. 3 is a cross-sectional elevation view of a portion of a substrate which includes two memory cells and separate means for providing charge for programming the cells as taught by the present invention.

FIG. 4 is a cross-sectional elevation view of a portion of a substrate which includes alternate means for generating charge for programming cells in a memory array.

FIG. 5 is a cross-sectional elevation view of a portion of a substrate which includes the presently preferred means for generating charge in the substrate for programming cells.

FIG. 6 is an electrical schematic for the charge injection means of FIG. 5.

FIG. 7 is a cross-sectional elevation view of a portion of a substrate which includes a two terminal memory cell which may be programmed with the teachings of the present invention.

FIG. 8 is an electrical schematic of a portion of a memory array employing the cell of FIG. 7 and the charge injection means of FIGS. 5 and 6.

DETAILED DESCRIPTION OF THE INVENTION

A memory which includes a plurality of nonvolatile memory cells is described. In the following description, numerous specific details are set forth such as specific conductivity types, oxide thicknesses, etc., in order to provide a thorough understanding of the present invention. It will be obvious to one skilled in the art, however, that the present invention may be practiced without these specific details. In other instances, well-known fabrication processes and devices are not described in detail in order to obscure the present invention in unnecessary detail.

In the presently preferred embodiment, the invention includes a plurality of memory cells fabricated utilizing well-known metal-oxide-semiconductor (MOS) technology. More specifically, the memory cells are fabricated on a p-type silicon substrate (30–50 ohm cm). Each memory cell includes at least one n+ region disposed in the substrate, a floating gate (a polysilicon member completely surrounded by silicon dioxide), and a control gate disposed above the floating gate. Any one of a plurality of prior art memory cells may be used with the present invention such as those set forth in the prior art section of this patent, or as shown in U.S. Pat. No. 4,267,632.

In the prior art, each of the cells is required to generate sufficient charge to charge its floating gate. With the present invention, a single source of charge is used for a plurality of cells.

Figure 1:
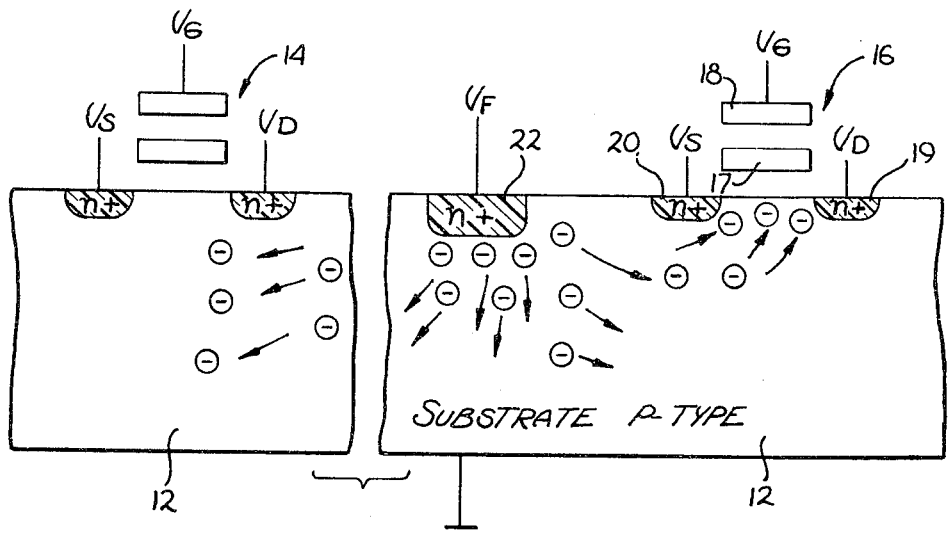
FIG. 1 is a cross-sectional elevation view of a portion of a substrate which includes two memory cells and a single source of charge for programming the cells as taught by the present invention.

Referring first to FIG. 1, a cross-sectional elevation view of a p-type silicon substrate 12 is illustrated. The substrate includes two electrically programmable read-only memory cells (EPROM) cells 14 and 16. Each cell, such as cell 16, includes a pair of substrate regions 19 and 20, a floating gate 17 and a control gate 18. (The break in the substrate between the region 22 and the cell 14 is used to illustrate that the cell 14 may be considerable distance from the region 22 and that a plurality of other memory cells may be fabricated between the region 22 and the cell 14.)

For the embodiment of FIG. 1, a forward biased junction is used to generate charge for programming the cells 14 and 16. An n-type region 22 is formed in the p-type substrate 12 to provide this junction. The junction is forward biased (negative potential) during programming. When this occurs, the junction injects minority carriers (electrons) into the p-type substrate as is shown in FIG. 1. The negative potential used to forward bias the junction can be supplied from an external source or from an on-chip back bias generator.

To program a selected cell such as cell 16, a positive potential is applied to the control gate 18 ($V_G$) and a positive potential is applied to either or both of the source and drain regions associated with cell 16. The electrons which are injected from the junction are diffused into the p-type substrate. They are accelerated by the potential under the gate 17 toward the interface between the gate and substrate. Some of the electrons gain sufficient energy to surmount the barrier and thus are injected through the oxide separating the floating gate and substrate and become trapped in the floating gate.

The acceleration potential is determined both by the potential on the source or drain region and the gate potential $V_G$. In general, the following equation applies:

$$V_G = V_D + V_{TVD}$$

where $V_{TVD}$ is the threshold voltage of the cell 16 with the threshold increased by the body effect generated by $V_D$. In the presently preferred embodiment, a positive potential is applied to the drain of the cell 16 and not to the source region 20. The above equation is generally true except in cases where $V_D$ is quite high and in those cases, $V_D$ will affect $V_{TH}$. Typically, however, $V_G$ will be at least one threshold voltage above the potential applied to $V_D$. Where $V_D$ is equal to 5 volts, the following approximate $V_G$ potentials are applicable for the indicated oxide thicknesses.

In general, in the beginning of the programming inversion conditions are preserved if:

$$V_G = V_D + V_{ti}(V_D)$$

where: $V_{ti}$ is the initial threshold of the cell 16 with the body effect due to $V_D$. For the case where the above equation applies, the accelerating voltage is $V_D$. After programming begins $V_T$ increases in the above equation hence the accelerataing voltage is reduced and the programming rate is reduced substantially. This sets a maximum threshsold voltage after programming which can be controlled by the following relation:

$$\Delta V_T(MAX) \approx V_G - (V_D + V_{Ti}(V_D))$$

An example of the voltages and oxide thicknesses involved for present and future cells is shown in the following table:

| $V_D$ | VG | Oxide Thickness in Angstroms Between Floating Gate and Substrate | Oxide Thickness in Angstroms Between Floating Gate and Substrate |
|---|---|---|---|
| 5 v | 10 v | 100 | 250 |
| 6 v | 12 v | 250 | 500 |
| 10 v | 20 v | 700–1000 | 1000 |

One important feature of the present invention is that the memory cells need not withstand the higher programming potentials or currents associated with the prior art cells. The programming of the cells with the present invention is not critically linked to the cell dimensions particularly /w as it is with some prior art cells. This is because the acceleration field, which is the normal depletion layer under the gate field, is almost unaffected by the channel length and width, and hence, the programming is unaffected. Programming occurs throughout the gate in comparison with limited regions of injection near the drain as occurs in prior art EPROM cells. Thus, the programming efficiency is substantially higher (by a factor of $10^3$ to $10^4$). The collected current in the high voltage drain terminal is small and hence the power consumption during programming is lower. The high electron current from region 22 is injected over a relatively small potential and thus the power consumed to generate these electrons is relatively small. The low energy consumed in programming enables the use of a five volt power supply with bootstrapping (on chip) to develop any needed higher potentials for programming.

The present invention only requires one substrate region, (e.g., drain) for programming. This allows the fabrication of two terminal devices and the forming of cell pairs as will be described in conjunction with FIGS. 7 and 8.

Referring again to FIG. 1, as described, to program cell 16 potentials are selectively applied to the control gate and drain region. Assuming no potential is applied to the control gate and drain region of the cell 14, the electrons in the substrate are not accelerated towards the cell 14 and thus the floating gate of this cell remains uncharged. To program the cell 14, potentials are applied to the drain and control gate of this cell, causing the electrons to be accelerated towards cell 14. Obviously, any cell or group of cells can be either simultaneously programmed or individually programmed by the selective application of potentials to the cells. Ordinary, well-known decoding circuits are employed to select cells for programming.

Figure 2:
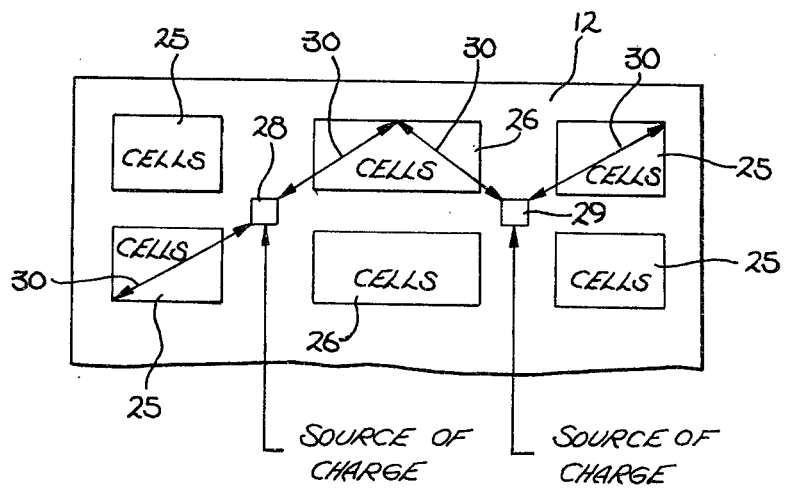
FIG. 2 is a plan view of a memory array fabricated in accordance with the present invention.

Referring to FIG. 2, four groups of cells 25 are illustrated along with two groups of cells 26. Two sources of charge 28 and 29 are disposed between groups of cells 25 and 26. The maximum distance between any of the cells in the groups of cells 25 and 26 and a source of charge is distance 30 for the layout of FIG. 2. In a typical memory, distance 30 can be a 100–300 microns using current MOS technology. Thus, a single source of charge can be used to program several hundred cells.

In FIG. 1, the forward biased junction is illustrated as a source of charge (electrons) for programming. This particular source of charge is perhaps best suited for CMOS processes since the CMOS process flow provides p+ n+ junctions along with the contacts to the junctions. Numerous other charge sources may be utilized as will be described in conjunction with FIGS. 3-6. Additionally, infrared or visible light may be used since photons create excess carriers in the bulk and may supply a source of excess electrons in the substrate. However, it is believed that this source of electrons is impractical.

Referring now to FIG. 3, a portion of a substrate 31 is illustrated along with two EPROM cells 32 and 33. Again, each of the cells include spaced-apart substrate regions, a floating gate and a control gate. An ohmic contact 36 is in contact with the substrate and receives a positive potential during programming. To program cell 32, positive potentials are applied to its drain terminal and to its gate terminal as described above. The drain region 34 of cell 33 is coupled to ground. When a positive potential is applied to contact 36, the ohmic contact 36 causes holes to be injected into the substrate. This, in turn, causes electron injection from the n-plus region 34. These electrons are then accelerated toward the floating gate of the cell 32 and become trapped in the floating gate as in the case of FIG. 1. To program the cell 33, the source terminal of the cell 32 is coupled to ground and positive potentials are applied to the gate and drain of cell 33 while a positive potential is applied to ohmic contact 36.

In FIG. 4, another source of electrons for charging cells in a memory array is illustrated. An ordinary field-effect transistor is fabricated on the substrate 37 along with memory cells (not illustrated). The transistor includes spaced-apart source and drain regions, (regions 40 and 39) and a gate 38. A positive potential is applied to the gate 38 and to the drain 39 while the source region 40 is coupled to ground. The MOS device is brought into saturation by these positive potentials. The channel electrons gain sufficient energy from the electric field in the pinch-off region to create new holes and electrons by impact ionization. The excess holes flow into the high resistivity substrate, causing the potential barrier to be lowered between the source region and substrate. Electrons then flow from the source into the positively biased substrate and can be accelerated into EPROM cells.

FIGS. 5 and 6 illustrate the presently preferred embodiment for the charge injection. It consists of an injection capacitor defined by the gate 47, the n-type region 49 of the substrate 43 and the intermediate oxide. This capacitor is coupled to a load device which may be an ordinary enhancement mode transistor. In FIG. 5, this transistor is illustrated as the regions 44 and 45, with the drain of region 44 being coupled to a gate 46. In FIG. 6, this arrangement is shown schematically as a capacitor and enhancement mode transistor. The gate 47 (one plate of the capacitor) is coupled to a pulse generator 50 through the line 48. The waveform generated by the pulse generator 50 is shown as waveform 51 in FIG. 6. It consists of a train of pulses which vary between 0 and $V_{CC}$ (5 volts). The n-type region 49 may be an ion implanted region such as those used for depletion mode transistors.

In operation, first the capacitor defined by the gate 47 and region 48 is charged through the enhancement mode transistor by the positive potential from the pulse generator 50. Then, when the output of the pulse generator drops, the load device is cut off and the charge in the inversion layer is injected into the substrate. The injection current is given by:

$$I_e = \frac{A\epsilon_o K_{SiO_2}}{X_o} \frac{V_{cc}}{t_p}$$

where $t_p$ is the pulse length, A the capacitor area, $X_o$ the oxide thickness, $\epsilon_o$ the permitivity of vacuum, and the $K_{SiO_2}$ dielectric constant of $SiO_2$. As can be seen from the above equation, the injection efficiency can be adjusted by varying the parameters A, $T_p$ and $X_o$. As mentioned, it is believed that the above-described injection capacitor provides the most efficient source of charge for n-channel MOS devices. It should be noted that an on-chip single pulse generator 50 can be used to activate (one at a time) each of the injection capacitors that are required for a particular memory array.

Referring now to FIG. 7, a two terminal EPROM cell is illustrated disposed on the substrate 53. It includes the n-type region 52, a floating gate 54 and the control gate 53 (This cell is like prior art cells except that it has only one substrate region). Once excess electrons are generated within the substrate 53 the floating gate may be charged by applying a positive potential to the drain region 52 and gate 53 as described above. Note that a source region is not required to charge the floating gate 54.

The two terminal device of FIG. 7 may be connected to a word line and bit line in a memory. The cell is read in the same manner that a dynamic RAM cell is read where inversion layer charge is sensed.

The cell of FIG. 7 may be coupled in an array in pairs as shown in FIG. 8. For example, cells 56 and 57 are coupled in series at a common junction 65. The drain terminal 52 of FIG. 7 for the cells of FIG. 8 are coupled to the bit lines in the array. For example, for cell 57 this region is coupled to the $Y_n$ line, and for cell 56 to the $Y_{n-1}$ line. The control gates of the cells are coupled to the word lines in the array, for example, cell 56 has its control gate coupled to word line $X_n$ while cell 57 has its control gate coupled to the word line $X_{n-1}$. Similarly, cells 58 and 59 are coupled in series through junction 66 and to word lines and bit lines. Also shown in FIG. 8 is the charge injection capacitor discussed in conjunction with FIGS. 5 and 6. The injection capacitor 60 is coupled through the load device (enhancement mode transistor 61) to the grounded line 62.

Any cell in the array of FIG. 8 may be programmed. For example, to program cell 57, positive potentials are applied to the word line $X_{n-1}$ and the bit line $Y_n$. Once again, the potential applied to the control gate exceeds the potential applied to the drain terminal by at least the threshold of the cell 57. When the electrons are generated through the injection capacitor 60, these electrons are accelerated sufficiently to overcome the barrier and become trapped on the floating gate of the cell 57. Similarly, any of the other cells can be programmed.

Each of the cell pairs such as cells 56 and 57 can store 2 bits of information. It is apparent that four possible states exist for the cell pair 56 and 57. The four states are: (i) neither cell programmed, (ii) both cells programmed, (iii) cell 56 programmed with a "one" and cell 57 with a "zero", and (iv) cell 57 with a "one" and cell 56 with a "zero". In order to determine the states of cells 56 and 57, two separate gate voltages for the word lines are required. By way of example, the higher gate potential is applied to the line $X_{n-1}$ with a lower gate potential to line $X_n$; the current level is sensed between the cells 56 and 57. Four different current levels exist corresponding to the 4 states of the cell pair (2 bits of data). It should be noted one reading is performed with the array of FIG. 8 to sense two bits of data. The array of FIG. 8, however, is more sensitive to cell geometry since the current levels depend on channel length and width.

The same result can be achieved for the array of FIG. 8 without using the different control gate potentials but rather by using different programming levels. Each floating gate of each cell pair can be programmed to one of two levels (or perhaps more). The programming level on each of the gates is controlled, for example, by controlling the injection time. These different programming levels in effect establish different threshold voltages for the programmed state of the devices. This is analogous to the 2 bits per cell scheme described in U.S. Pat. No. 4,287,570.

In the above description, the programming mechanism of the present invention was described in conjunction with EPROM devices. The invention may be used equally well with electrically programmable and electrically erasable memory cells ($E^2$PROM cells). The programming described above may be used and erasing can occur with the erasing techniques well-known in the prior art such as tunneling through a thin oxide.

Figure 9:
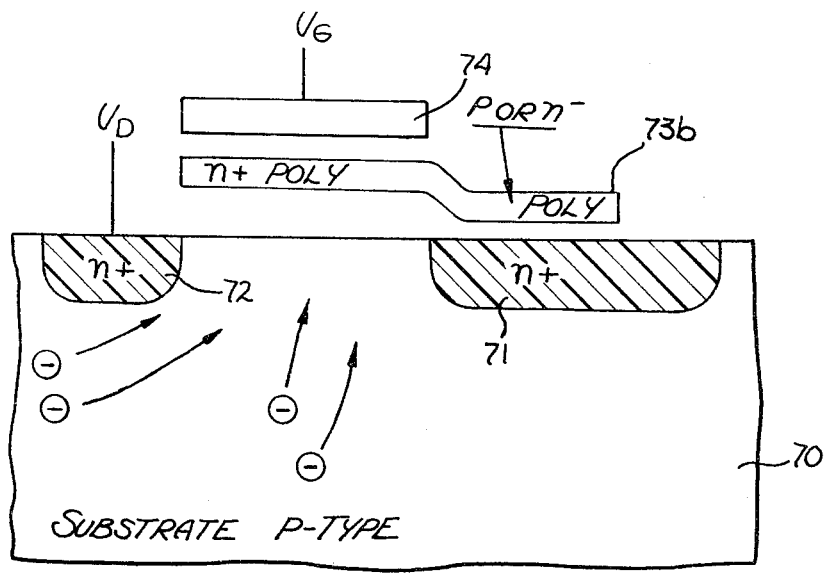
FIG. 9 is a cross-sectional elevation view of a portion of a substrate which includes an electrically programmable and electrically erasable memory cell which may be programmed with the teachings of the present invention.

One novel $E^2$PROM cell which can be used with the present invention is shown in FIG. 9 disposed on the p-type silicon substrate 70. The cell includes a pair of spaced-apart n+regions 71 and 72. A floating gate 73 extends over the channel defined by the regions 71 and 72 (section 73a). Another section of the same floating gate extends over the region 71. It is preferred that the section 73a of the polysilicon floating gate be doped with an n+ dopant. The section 73b may be doped with a p-type dopant or may be doped to an n- level with an n-type dopant.

The memory cell of FIG. 9 may be fabricated utilizing ordinary MOS technology. Separate masking steps are required to provide the two different doping levels (or types of dopant) in the floating gate. In the presently preferred embodiment, the oxide between the region 71 and the floating gate 73 is thinner than the oxide between the channel and the floating gate sections 73a. By way of example, the oxide thickness between the channel and section 73a may be 700 A thick whereas the oxide thickness separating the section 73b from the region 71 may be 400 A thick. For those cells fabricated with the two thicknesses of oxide, a separate masking step and controlled etching step may be used to obtain the different thickness of oxide or other known process may be used.

To program the cell of FIG. 9, a positive potential is applied to one or both of the regions 71 and 72 with a higher potential being applied to the gate 74 as described above. The excess electrons are generated within the substrate and are accelerated through the barrier separating the floating gate from the substrate and remain trapped thereon as described above.

Erasing is performed by avalanche injection from the section 73b of the floating gate into the region 71. The application of positive pulse to the region 71 generates a deep depletion region within the floating gate. As a result, electrons are accelerated in the high electric field of this depletion region and part of them gain enough energy to surmount the potential barrier and inject into the region 71. Most of the electrons do not gain sufficient energy and remain near the interface creating an inversion layer which destroys the deep depletion region. As a result, a train of pulses are applied to regions 71 so that the above-described mechanism of injection is repeated a sufficient number of times to remove the negative charge from the floating gate.

The avalanche efficiency of this erasing mechanism is affected by the extent of doping in the sections 73b of the gate, the magnitude of the pulse applied to the region 71, the oxide thickness between the region 71 and the section 73b of the floating gate, the duration of the pulses, the duration of the time between each pulse, and the erase area. Note that the pulse must remain low long enough so that the inversion layer which is formed by the previous pulse deteriorates. To some extent, the erase mechanism is also a function of the size of the grains in the floating gate. The size of the grain affects the depletion region and also the number of electrons trapped.

One advantage to the above-described $E^2$ cell over those employing the tunnel mechanism for erasure is that unlike the thin oxide regions in these latter cells, there should be no oxide breakdown. Some long-term deterioration in erasing will occur, however, due to electrons which remain trapped in the oxide. But on balance, the cell should be able to withstand many more erase cycles than those prior art cells employing tunneling.

Figure 10:
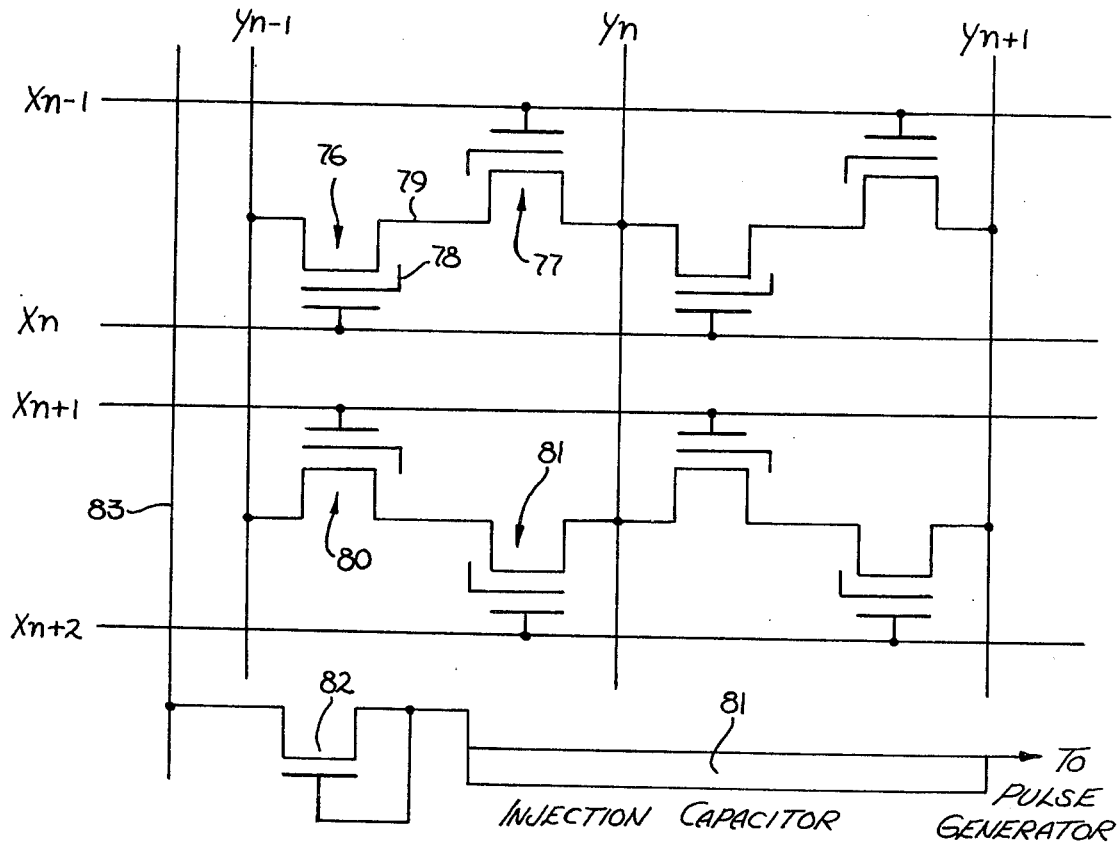
FIG. 10 is an electrical schematic of a portion of a memory array employing the cells of FIG. 9 and the charge injection means of FIGS. 5 and 6.

The cell of FIG. 9 may be coupled into an array as shown in FIG. 10. As was the case with the array of FIG. 8, the array includes an injection capacitor 81, load device 82, and a grounding line 83. The cells are coupled in series pairs such as cell 76 and 77. The sections of each floating gate which extends over the substrate region are shown by the perpendicular lines extending from the floating gate such as line 78. Similarly, cells 80 and 81 and the remaining cells in the array are connected in a manner which resembles the array of FIG. 8.

To program any particular cell, for example, cell 76, a positive potential is applied to the word line $X_n$ and the bit line $Y_{n-1}$. Electrons from the injection capacitor 81 are then stored on the floating gate of cell 76 as described above. Similarly, any other cell in the array may be programmed.

Two levels of potentials are used on the word lines for reading. The first level is a sensing level which causes the device to conduct only of its floating gate is not programmed (not charged). The second level is a higher potential which causes the device to conduct even if its floating gate is programmed (negatively charged). The threshold voltage of each cell is not negative after an erase cycle, that is, there are no normally on devices. This is achieved because the applied erase pulses are generated on-chip. Once the erase cell begins to conduct, the high voltage generator cannot support this high current level and hence this voltage is reduced which stops the erasures. To sense the state of the floating gate of cell 77, for instance, the higher gate potential is applied to line $X_n$, causing cell 76 to conduct. If current flows between lines $Y_n$ and $Y_{n-1}$ with the lower potential supplied to word line $X_{n-1}$, it is known that the floating gate of cell 77 is uncharged. Conversely, if current does not flow the floating gate of cell 77 is charged. To sense the state of cell 76 the higher potential is applied to line $X_{n-1}$ and the lower potential to line $X_n$.

To erase a particular cell such as cell 77, cell 76 is made to conduct by applying the higher gate potential to line $X_n$ allowing the positive pulses to be applied to regions 79. Note since there is a conductive path through cell 76 when cell 77 is being erased, cell 76 is not erased.

It should be noted that with the above $E^2$ cell a one device per bit memory is achieved. Currently an additional device per cell is required.

Thus, a memory array has been disclosed wherein single sources of charge are used to provide charge for a plurality of nonvolatile memory devices. The use of such single sources of charge allows the memory cells to be fabricated with less critical dimensions in some cases and in other cases as two terminal devices.

I claim:

1. An electrically programmable memory disposed on a substrate including:
   a plurality of electrically programmable memory cells formed on the surface of said substrate each having at least one region disposed in said substrate, a charge storing region and a control gate;
   charge generation means formed on said surface of said substrate for causing a charge imbalance in said substrate such that charge is present for charging any one of said plurality of said cells; and,
   electrical means coupled to said cells for selectively applying potentials to said cells such that said charge is caused to accelerate towards at least one of said charge storing regions and to become trapped therein,
   whereby a plurality of cells may be programmed from a single source of charge formed on said substrate.

2. The memory defined by claim 1 wherein said charge generation means comprises a forward biased junction disposed in said substrate from said surface.

3. The memory defined by claim 1 wherein said charge generation means comprises a metal-oxide-semiconductor device formed on said surface of said substrate which is in saturation for programming.

4. The memory defined by claim 1 wherein said charge generation means comprises hole injection means formed on said surface for injecting holes into said substrate and a source of electrons which provides electrons in response to said injected holes.

5. The memory defined by claim 4 wherein said source of electrons is an n-type region disposed in said substrate from said surface said n-type region being coupled to ground.

6. The memory defined by claim 1 wherein said charge generation means comprises a charge injection capacitor.

7. The memory defined by claim 6 wherein said charge injection capacitor includes a region in said substrate coupled to a load device and a gate coupled to a pulse generator.

8. An electrically programmable memory disposed on a substrate including:
   a plurality of electrically programmable memory cells formed on the surface of said substrate each having at least one region disposed in said substrate, a floating gate disposed above said surface of said substrate and a control gate disposed above said floating gate and insulated from said floating gate;
   a source of electrical charge, formed from said surface of said substrate for providing charge for programming said plurality of cells;
   electrical means for applying a first potential to at least a selected one of said regions and a second potential to a selected one of said control gates, said selected control gate being from the same selected cell as said selected region, such that charge is sufficiently accelerated towards said selected cell to overcome the barrier between said floating gate and substrate and become stored in said floating gate,
   whereby a plurality of cells may be selectively charged from a single source of charge.

9. The memory defined by claim 8 wherein said second potential is greater than said first potential.

10. The memory defined by claim 9 wherein said second potential exceeds said first potential by at least the threshold voltage of said cells.

11. The memory defined by claim 10 wherein said source of electrical charge comprises a forward biased junction.

12. The memory defined by claim 10 wherein said source of electrical charge comprises a metal-oxide-semiconductor device which is in saturation.

13. The memory defined by claim 10 wherein said source of electrical charge comprises hole injection means for injecting holes in said substrate and a source of electrons which provides electrons in response to said injected holes.

14. The memory device defined by claim 10 wherein said source of electrical charge comprises a charge injection capacitor.

15. The memory defined by claim 14 wherein said charge injection capacitor includes a region in said substrate coupled to a load device and a gate coupled to a pulse generator.

16. The memory defined by claim 8 wherein said cells are coupled in series pairs, with a common substrate region disposed between each pair of cells.

17. The memory defined by claim 16 wherein said regions associated with said pairs of cells are coupled to different bit lines in said memory and wherein said control gates of each pair of cells are coupled to different word lines in said memory.

18. An electrically programmable and electrically erasable memory disposed on a surface of a substrate including:
   a plurality of electrically programmable and electrically erasable memory cells formed on said surface each having two regions disposed in said substrate, a charge storing region and a control gate;
   charge generation means formed on said surface of said substrate for causing a charge imbalance in said substrate such that charge is present for charging any one of said plurality of cells; and,
   electrical means coupled to said cells for selectively applying potentials to said cells such that charge is caused to accelerate towards at least one of said cells with sufficient energy to be trapped in said charge storing region of said cell,
   whereby a plurality of cells may be programmed from a single source of charge.

19. The memory defined by claim 18 wherein said charge storing region comprises a polysilicon floating gate.

20. The memory defined by claim 19 wherein in each of said cells, said floating gates is disposed over the channel defined by said regions and extends over one of said regions.

21. The memory defined by claim 20 wherein each of said floating gates is doped with an n-type dopant over said channel region and with a p-type dopant over said one of said regions.

22. The memory defined by claim 20 wherein each of said floating gates is n+ over said channel and n− over said one of said regions.

23. The memory defined by claim 20 wherein said cells are coupled into series pairs and wherein said one of said regions of each of said pairs are a common region between said cells.

24. The memory defined by claim 20 wherein said charge generation means comprises a charge injection capacitor.

25. The memory defined by claim 24 wherein said charge injection capacitor includes a region in said substrate coupled to a load device and a gate coupled to a pulse generator.

26. The memory defined by claim 20 wherein said charge generation means comprises a metal-oxide-semiconductor device disposed in said substrate which is in saturation.

27. The memory defined by claim 20 wherein said charge generation means comprises a forward biased junction disposed in said substrate.

28. The memory defined by claim 20 wherein said charge generation means comprises hole injection means and source of electrons which provide electrons in response to said injected holes.

29. In a memory which includes a plurality of electrically programmable memory cells fabricated on a surface of a substrate, a method for programming said cells comprising:
generating a charge imbalance from said surface of said substrate such that excess electrons are present in the region of said plurality of cells;
selectively applying potentials to said cells to cause said excess electrons to be accelerated towards at least a selected one of said cells with sufficient energy to program said cell;
whereby a plurality of cells may be programmed from a single source of charge.

* * * * *